US012585197B2

(12) United States Patent
Lee et al.

(10) Patent No.: US 12,585,197 B2
(45) Date of Patent: Mar. 24, 2026

(54) MONITORING UNIT AND SUBSTRATE TREATING APPARATUS INCLUDING THE SAME

(71) Applicant: Samsung Electronics Co., Ltd., Suwon-si (KR)

(72) Inventors: Yoon Sang Lee, Suwon-si (KR); Eun Hee Jeang, Suwon-si (KR); Dong Hyeong Kim, Suwon-si (KR); Teun Boeren, Suwon-si (KR); Jeong-Gil Kim, Suwon-si (KR); Kyung Bin Park, Suwon-si (KR); Hyuck Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 18/242,407

(22) Filed: Sep. 5, 2023

(65) Prior Publication Data

US 2024/0184216 A1 Jun. 6, 2024

(30) Foreign Application Priority Data

Dec. 1, 2022 (KR) ........................ 10-2022-0165935

(51) Int. Cl.
G03F 7/00 (2006.01)

(52) U.S. Cl.
CPC .................................. G03F 7/7055 (2013.01)

(58) Field of Classification Search
CPC .............................. G03F 7/7055; G03F 7/7085
See application file for complete search history.

(56) References Cited

U.S. PATENT DOCUMENTS

| | | | |
|---|---|---|---|
| 6,825,481 B2 | 11/2004 | Miyake | |
| 7,916,274 B2 | 3/2011 | Sogard | |
| 8,587,767 B2 | 11/2013 | Fiolka et al. | |
| 9,354,529 B2 | 5/2016 | Ehm et al. | |
| 10,451,559 B2 | 10/2019 | Voorst et al. | |
| 10,845,706 B2 | 11/2020 | Steeghs et al. | |
| 11,048,173 B2 | 6/2021 | Baumer | |
| 2004/0227102 A1* | 11/2004 | Kurt ................. | G01N 21/95684 |
| | | | 250/491.1 |
| 2005/0274897 A1* | 12/2005 | Singer ................... | G03F 7/7085 |
| | | | 250/372 |
| 2006/0091328 A1* | 5/2006 | Kanazawa .......... | G03F 7/70033 |
| | | | 250/504 R |
| 2008/0049206 A1* | 2/2008 | Ossmann ............. | G03F 7/70725 |
| | | | 355/68 |
| 2008/0083878 A1* | 4/2008 | Ehm ................... | G03F 7/70925 |
| | | | 250/372 |

(Continued)

*Primary Examiner* — Steven H Whitesell

(74) *Attorney, Agent, or Firm* — Muir Patent Law, PLLC

(57) ABSTRACT

A monitoring unit for measuring, in real time, the power of an EUV beam transmitted to a substrate and a substrate treating apparatus including the monitoring unit. The substrate treating apparatus comprising a source which generates an EUV beam, a scanner which transfers a mask pattern to a substrate by using the EUV beam, and a monitoring unit which comprises a detector for detecting the EUV beam and monitoring the power of the EUV beam in real time, wherein the detector is disposed on a path along which the EUV beam passes through a first mirror assembly provided in the scanner and moves to a reticle on which the mask pattern is formed.

17 Claims, 16 Drawing Sheets

(56)     References Cited

U.S. PATENT DOCUMENTS

| | | | | |
|---|---|---|---|---|
| 2008/0151221 A1* | 6/2008 | Sogard | .................. | G03F 7/7085 |
| | | | | 356/51 |
| 2008/0258070 A1* | 10/2008 | Scholz | .................... | H05G 2/00 |
| | | | | 250/372 |
| 2008/0315134 A1* | 12/2008 | Ehm | .................... | G03F 7/70941 |
| | | | | 250/504 R |
| 2009/0015814 A1* | 1/2009 | Mueller | ............. | G03F 7/70558 |
| | | | | 355/68 |
| 2012/0262690 A1* | 10/2012 | De Boeij | ........... | G03F 7/70116 |
| | | | | 355/67 |
| 2013/0026393 A1* | 1/2013 | Abe | .................... | H05G 2/0086 |
| | | | | 250/504 R |
| 2013/0134318 A1* | 5/2013 | Abhari | ............... | G02B 19/0095 |
| | | | | 250/372 |
| 2016/0004164 A1* | 1/2016 | Ruoff | ................ | G02B 27/0905 |
| | | | | 355/71 |
| 2016/0195816 A1* | 7/2016 | Endres | ............... | G03F 7/70075 |
| | | | | 355/71 |
| 2016/0202118 A1* | 7/2016 | Ehrmann | .................. | G01J 3/18 |
| | | | | 250/252.1 |
| 2018/0074410 A1* | 3/2018 | Mueller | ............. | G03F 7/70116 |
| 2019/0101831 A1* | 4/2019 | Chung | ............... | G03F 7/70033 |
| 2022/0057717 A1 | 2/2022 | Fischer et al. | | |
| 2023/0008139 A1* | 1/2023 | Swillam | ............... | G03F 9/7069 |
| 2024/0184216 A1* | 6/2024 | Lee | .................... | G03F 7/70558 |

* cited by examiner

100

1

MONITORING UNIT AND SUBSTRATE TREATING APPARATUS INCLUDING THE SAME

This application claims the benefit of priority under 35 USC § 119 to Korean Patent Application No. 10-2022-0165935, filed on Dec. 1, 2022, in the Korean Intellectual Property Office, the disclosure of which is incorporated herein in its entirety by reference.

BACKGROUND

1. Field

The present disclosure relates to a monitoring unit and a substrate treating apparatus using the same, and more particularly, to a monitoring unit applicable to exposure equipment using extreme ultraviolet (EUV) beams and a substrate treating apparatus including the monitoring unit.

2. Description of the Related Art

Extreme ultraviolet (EUV) scanner equipment is a type of photolithography equipment that creates fine patterns using light. Currently, the biggest bottleneck in product production utilizing the EUV scanner equipment is power loss. The EUV scanner equipment has more difficulty in securing sufficient power for a light source than equipment using deep ultraviolet (DUV) beams. In addition, there is no material that transmits or reflects EUV beams with very high efficiency. Therefore, the EUV scanner equipment suffers from a very large power loss in the process of transmitting an EUV beam to a substrate (wafer).

SUMMARY

Aspects of the present disclosure provide a monitoring unit for measuring, in real time, the power of an extreme ultraviolet (EUV) beam transmitted to a substrate and a substrate treating apparatus including the monitoring unit.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a substrate treating apparatus. The substrate treating apparatus comprises a source which generates an extreme ultraviolet (EUV) beam; a scanner which transfers a mask pattern to a substrate by using the EUV beam; and a monitoring unit which comprises a detector for detecting the EUV beam and monitors an EUV beam power in real time, wherein the detector is disposed on a path along which the EUV beam passes through a first mirror assembly provided in the scanner and moves to a reticle on which the mask pattern is formed.

According to an aspect of the present disclosure, there is provided a monitoring unit installed in a substrate treating apparatus, which irradiates an EUV beam to a substrate, and is configured to monitor an EUV beam power in real time. The monitoring unit comprises a detector which detects the EUV beam; a signal amplifier which amplifies a signal output by the detector; and a data processing system which calculates the EUV beam power based on the amplified signal.

According to another aspect of the present disclosure, there is provided a substrate treating apparatus. The substrate treating apparatus comprises a source which generates an EUV beam; a scanner which transfers a mask pattern to a substrate by using the EUV beam; and a monitoring unit which monitors an EUV beam power in real time, wherein the monitoring unit includes a detector which detects the EUV beam, a signal amplifier which amplifies an optical signal output by the detector, a filter which filters the amplified signal, and a data processing system which calculates the EUV beam power based on the amplified signal, and the scanner includes a first mirror assembly which comprises a plurality of mirrors and receives the EUV beam from the source, a second mirror assembly which comprises a plurality of mirrors and reflects the EUV beam reflected by the first mirror assembly to a reticle and a beam dump which is disposed at the same level as the second mirror assembly and receives the EUV beam reflected by the first mirror assembly, wherein the detector is provided inside or outside the beam dump.

It should be noted that the effects of the present disclosure are not limited to those described above, and other effects of the present disclosure will be apparent from the following description.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
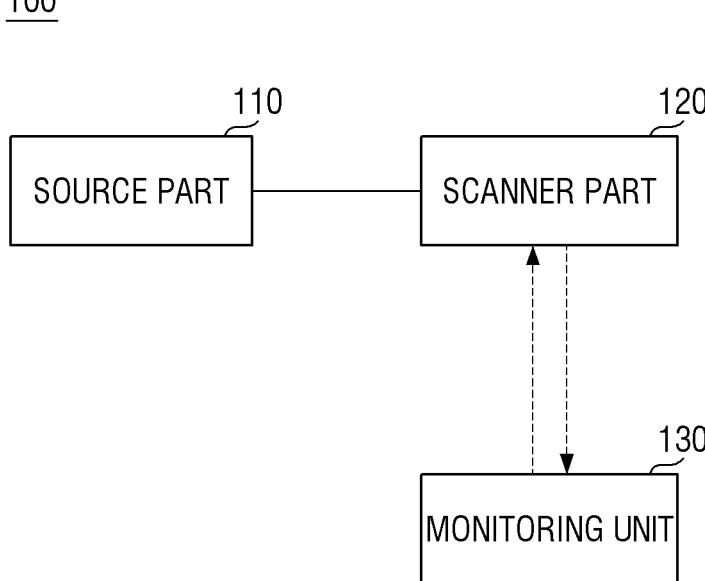
FIG. 1 is a block diagram schematically illustrating the internal configuration of a substrate treating apparatus for treating a substrate using EUV beams.

Hereinafter, exemplary embodiments of the present disclosure will be described in detail with reference to the accompanying drawings. The same components in the drawings will be denoted by the same reference numerals, and an overlapping description thereof will be omitted.

The present disclosure relates to a monitoring unit capable of measuring, in real time, the power of an extreme ultraviolet (EUV) beam transmitted to a substrate in a state where the EUV beam contains information about a fine pattern formed on a mask in exposure equipment using EUV beams and a substrate treating apparatus including the monitoring unit. Hereinafter, the present disclosure will be described in detail with reference to drawings and the like.

FIG. 1 is a block diagram schematically illustrating the internal configuration of a substrate treating apparatus 100 for treating a substrate using EUV beams. According to FIG. 1, the substrate treating apparatus 100 may include a source part 110, a scanner part 120, and a monitoring unit 130.

The substrate treating apparatus 100 forms a fine pattern on a substrate (e.g., a wafer) by using beams. The substrate treating apparatus 100 is equipment for performing a photolithography process and may use EUV beams having a very short wavelength (a wavelength of 13.5 nm). The substrate treating apparatus 100 may be provided as, for example, EUV scanner equipment.

The source part 110 is a light source and generates an EUV beam. The source part 110 may generate an EUV beam using a laser produced plasma (LPP) method. Here, the LPP method refers to a method of forming plasma by concentrating a laser beam.

When receiving an EUV beam from the source part 110, the scanner part 120 transfers a mask pattern of a reticle to a substrate by using the EUV beam. To this end, as illustrated in FIG. 2, the scanner part 120 may include a first driving module 210, a second driving module 220, and an optical module 230.

Figure 2:
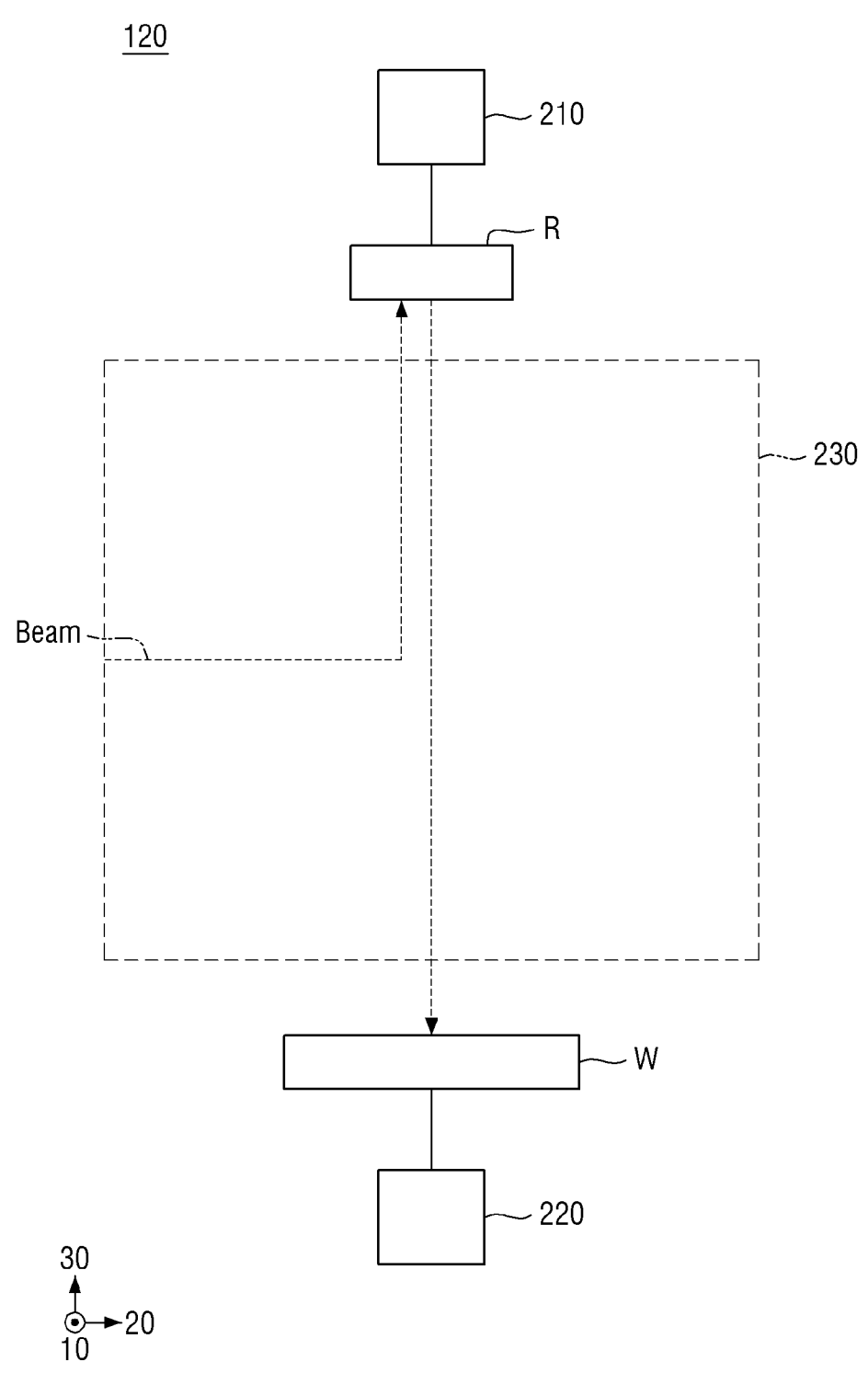
FIG. 2 schematically illustrates the internal configuration of the scanner part constituting the substrate treating apparatus.

FIG. 2 schematically illustrates the internal configuration of the scanner part 120 constituting the substrate treating apparatus 100. The following description will be given with reference to FIG. 2.

The first driving module 210 controls the movement of a reticle R. The first driving module 210 and the reticle R may be disposed above the optical module 230, and the first driving module 210 may be provided as, for example, a main body top module.

Figure 3:
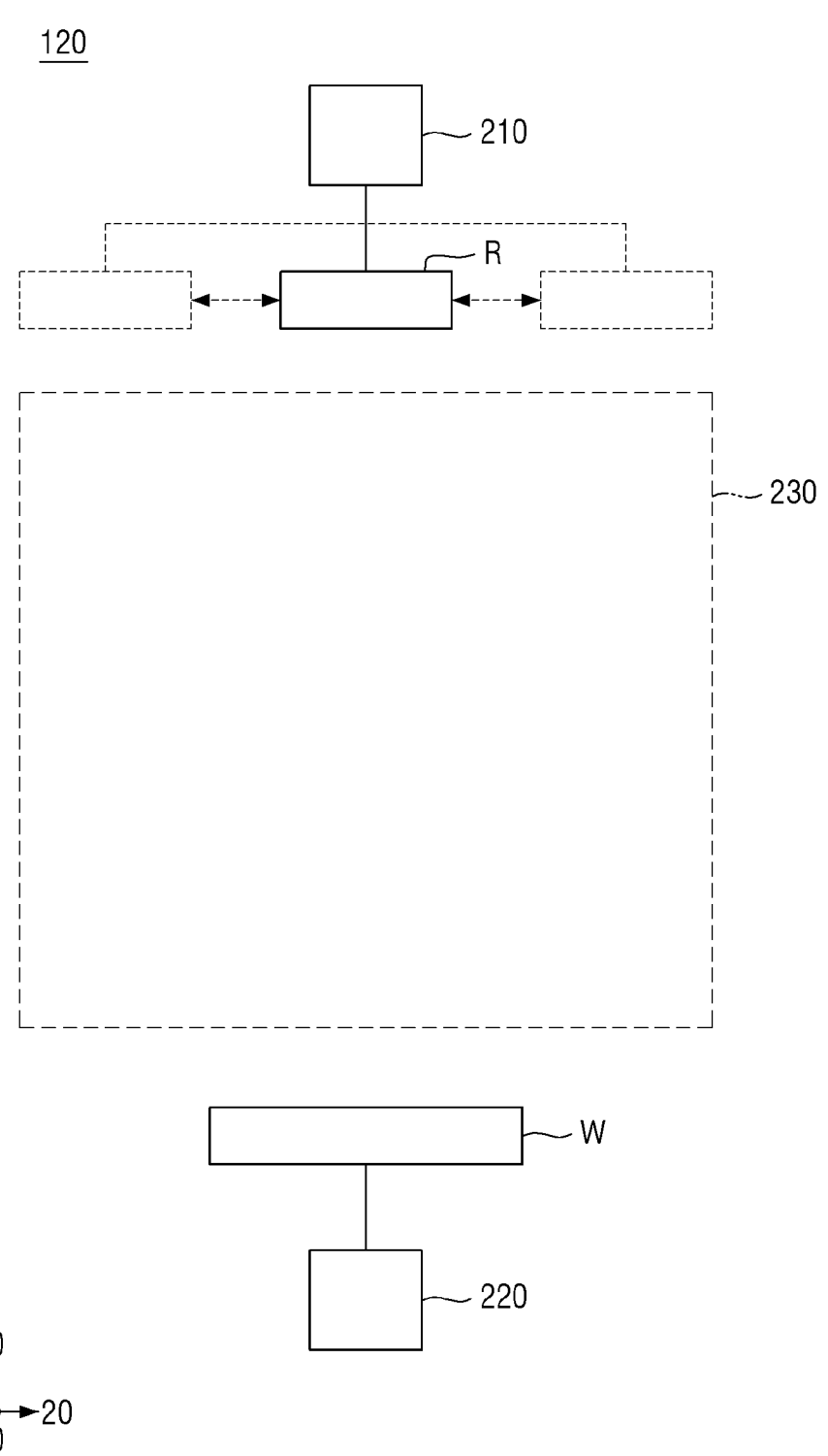
FIG. 3 is an example diagram for explaining the function of the first driving module constituting the scanner part.

As illustrated in the example of FIG. 3, the first driving module 210 may move the reticle R in a horizontal direction (second direction 20) above the optical module 230. The first driving module 210 may move the reticle R in the horizontal direction according to the movement direction of an EUV beam in the optical module 230. However, the present disclosure is not limited thereto, and the first driving module 210 may also move the reticle R in a vertical direction (third direction 30) above the optical module 230. Alternatively, the first driving module 210 may move the reticle R not only in the horizontal direction but also in the vertical direction above the optical module 230. FIG. 3 is an example diagram for explaining the function of the first driving module 210 constituting the scanner part 120.

The second driving module 220 controls the movement of a substrate W. The second driving module 220 and the substrate W may be disposed below the optical module 230, and the second driving module 220 may be provided as, for example, a main body bottom module.

Figure 4:
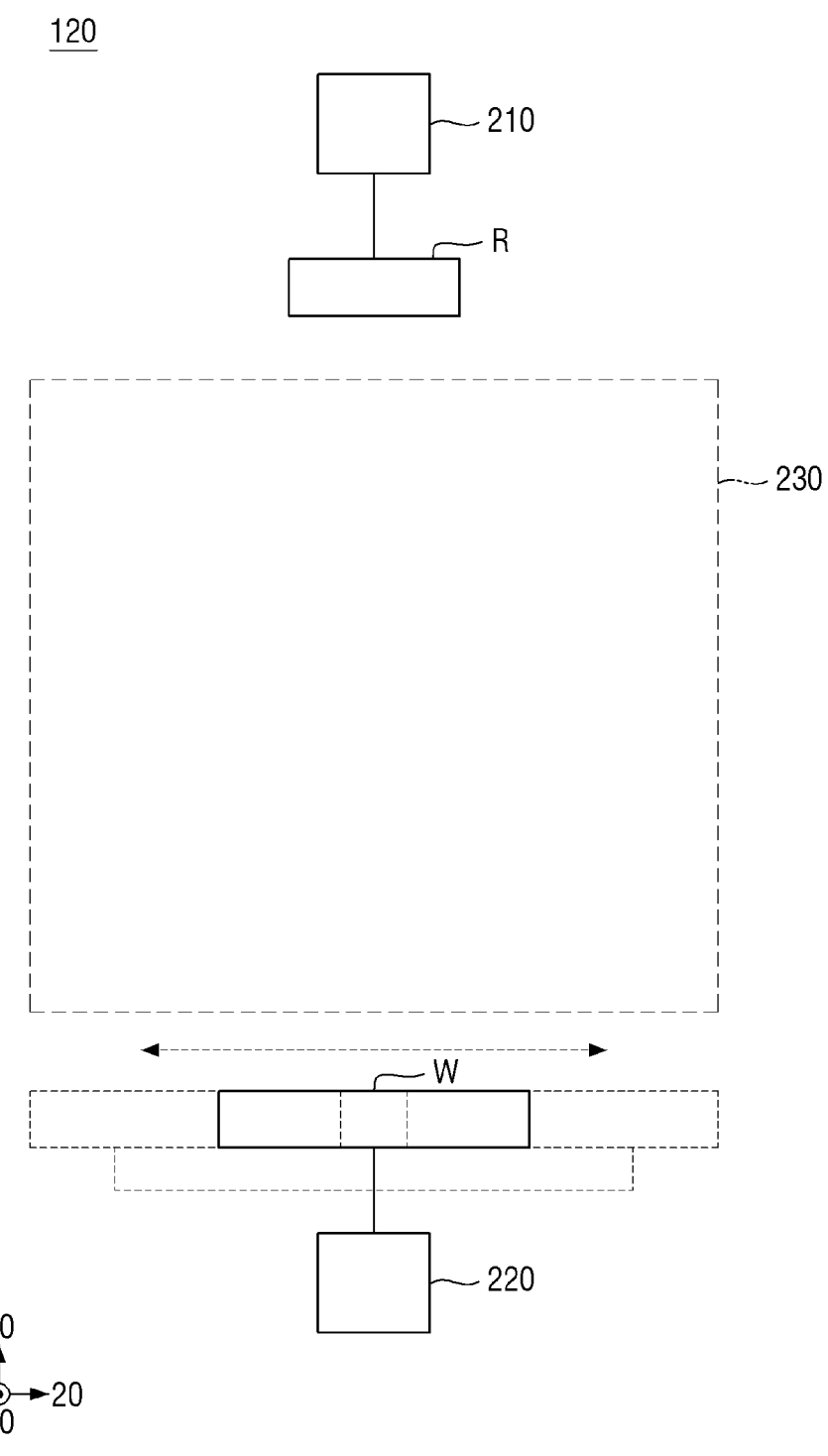
FIG. 4 is an example diagram for explaining the function of the second driving module constituting the scanner part.

As illustrated in the example of FIG. 4, the second driving module 220 may move the substrate W in the horizontal direction (second direction 20) below the optical module 230. The second driving module 220 may move the substrate W in the horizontal direction according to the movement direction of the EUV beam in the optical module 230. However, the present disclosure is not limited thereto, and the second driving module 220 may also move the substrate W in the vertical direction (third direction 30) below the optical module 230. Alternatively, the second driving module 220 may move the substrate W not only in the horizontal direction but also in the vertical direction below the optical module 230. FIG. 4 is an example diagram for explaining the function of the second driving module 220 constituting the scanner part 120.

The first driving module 210 and the second driving module 220 may independently move the reticle R and the substrate W according to the movement direction of the EUV beam. In this case, the first driving module 210 and the second driving module 220 may simultaneously move the reticle R and the substrate W or may move the reticle R and the substrate W at different times.

Referring again to FIG. 2, when receiving an EUV beam from the source part 110, the optical module 230 moves the received EUV beam to the reticle R. In addition, when the EUV beam is reflected by the reticle R, the optical module 230 moves the reflected EUV beam to the substrate W. The EUV beam reflected by the reticle R contains information about a fine pattern formed on the reticle R. Therefore, when the EUV beam reflected by the reticle R is moved to the substrate W by the optical module 230, the fine pattern formed on the reticle R may be reflected on the substrate W.

The optical module 230 is a module that actually transfers an EUV beam and may be disposed between the first driving module 210 and the second driving module 220. The optical module 230 may be provided as, for example, a main body middle module.

As described above, the optical module 230 may move an EUV beam provided by the source part 110 to the reticle R and may move the EUV beam reflected by the reticle R to the substrate W. To this end, the optical module 230 may include a first movement control module 310 and a second movement control module 320 as illustrated in FIG. 5.

Figure 5:
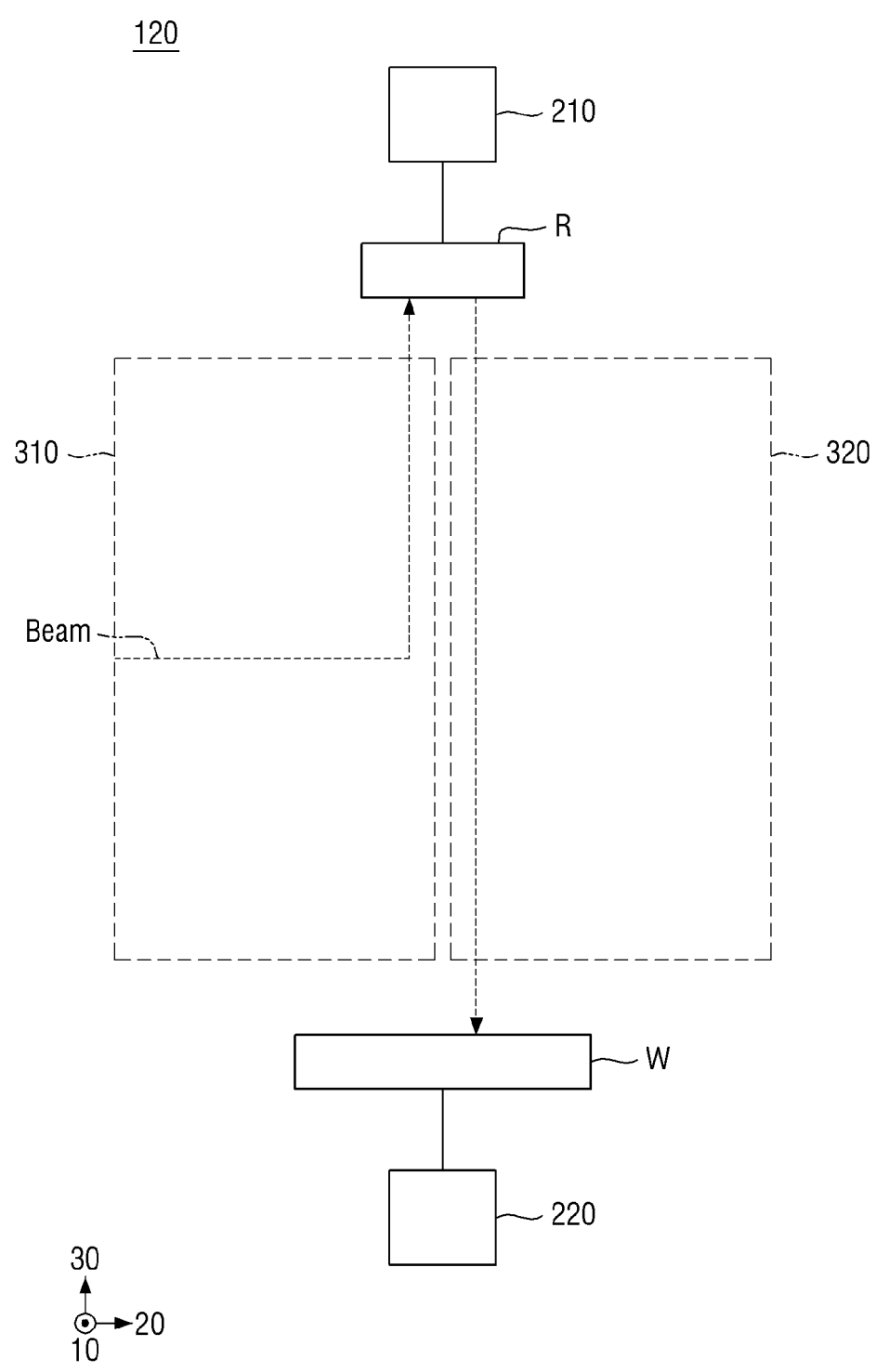
FIG. 5 schematically illustrates the internal configuration of the optical module constituting the scanner part.

FIG. 5 schematically illustrates the internal configuration of the optical module 230 constituting the scanner part 120. The following description will be given with reference to FIG. 5.

The first movement control module 310 moves an EUV beam provided by the source part 110 to the reticle R. The first movement control module 310 may be provided as, for example, an illuminator module (ILLUMO) that controls the EUV beam incident on the reticle R.

The EUV beam generated by the source part 110 is reflected by a collector and then transferred to the reticle R through the first movement control module 310. Then, the EUV beam containing information about a mask pattern formed on the reticle R is irradiated to the substrate W through the second movement control module 320. The first movement control module 310 may include a plurality of mirror assemblies to transfer the EUV beam reflected by the collector to the reticle R. The first movement control module 310 may include, for example, three mirror assemblies such as a first mirror assembly 410, a second mirror assembly 420, and a third mirror assembly 430 as illustrated in FIG. 6.

Figure 6:
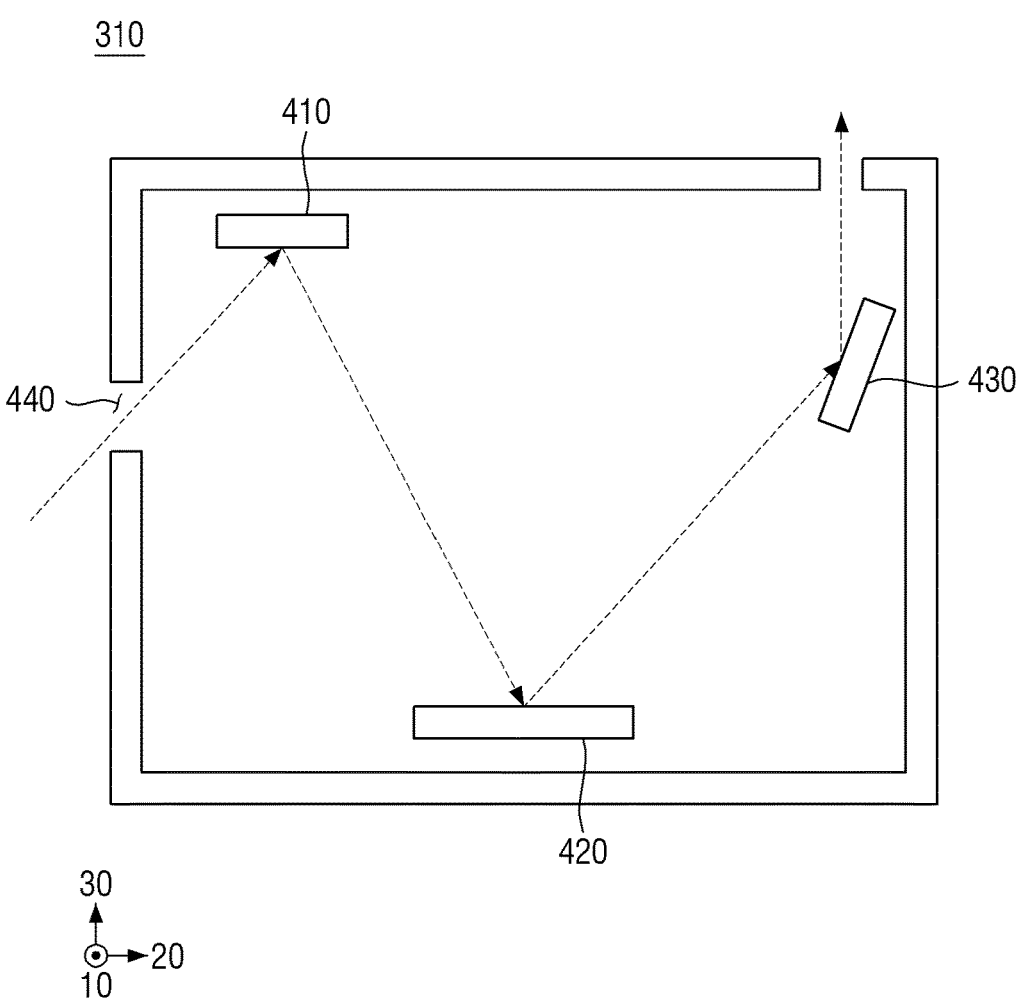
FIG. 6 is an example diagram schematically illustrating the internal structure of the first movement control module constituting the optical module.

FIG. 6 is an example diagram schematically illustrating the internal structure of the first movement control module 310 constituting the optical module 230. The following description will be given with reference to FIG. 6.

An EUV beam passes through an intermediate focus (IF) region 440 and enters the first movement control module 310. The first mirror assembly 410 reflects the EUV beam entering the first movement control module 310 to the second mirror assembly 420. The first mirror assembly 410 may be provided as a field facet mirror (FFM).

Figure 7:
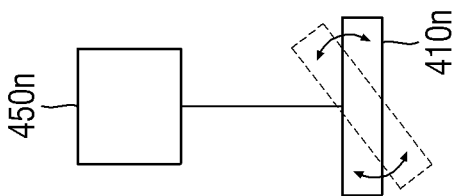
FIG. 7 is a first example diagram for explaining a method of operating the first mirror assembly constituting the first movement control module.
Figure 7:
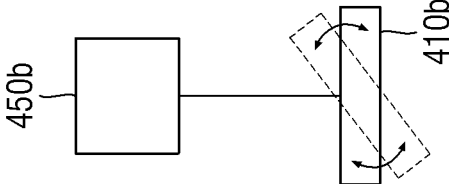
Figure 7:
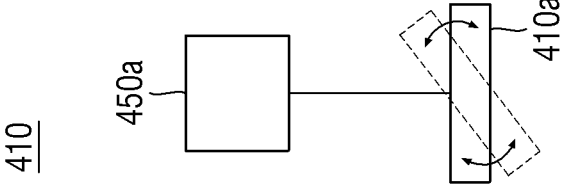
Figure 7:
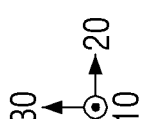
Figure 8:
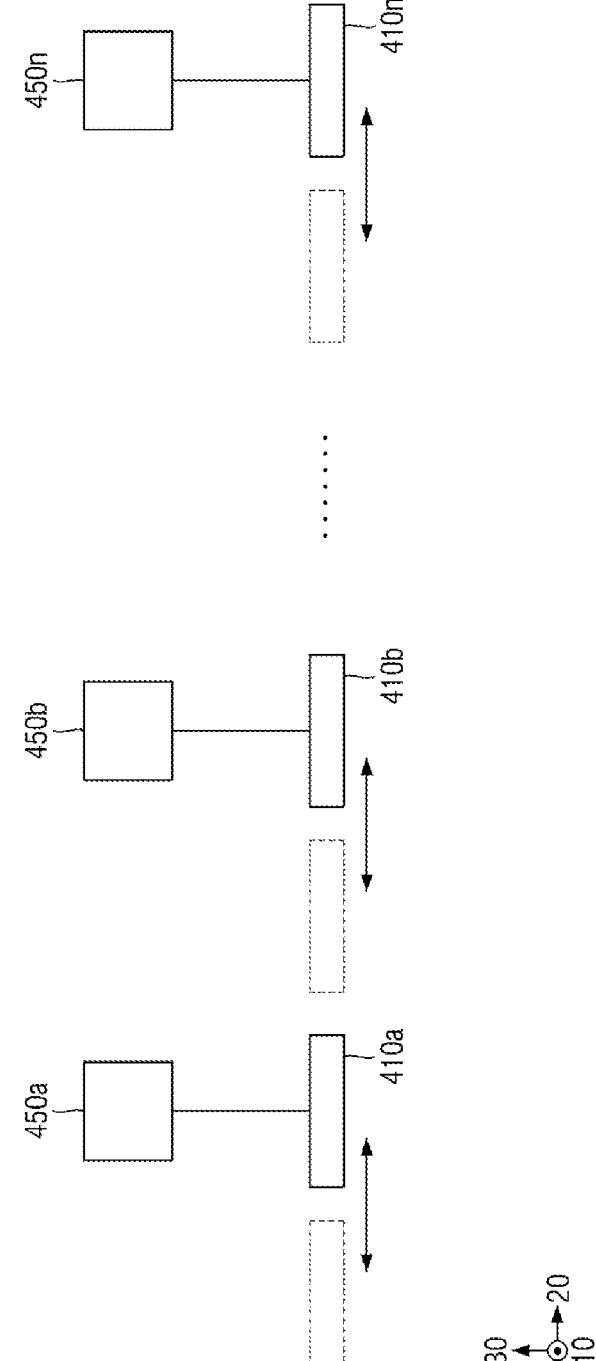
FIG. 8 is a second example diagram for explaining a method of operating the first mirror assembly constituting the first movement control module.

As illustrated in FIG. 7, the first mirror assembly 410 may be composed of a plurality of mirrors 410a, 410b, . . . , 410n. Each of the mirrors 410a, 410b, . . . , 410n may have a slit shape and may be connected to an actuator. The mirrors 410a, 410b, . . . , 410n may be respectively rotated by actuators 450a, 450b, . . . , 450n as illustrated in the example of FIG. 7. However, the present disclosure is not limited thereto, and the mirrors 410a, 410b, . . . , 410n may also be respectively horizontally moved by the actuators 450a, 450b, . . . , 450n as illustrated in the example of FIG. 8. Alternatively, the mirrors 410a, 410b, . . . , 410n may be respectively vertically moved by the actuators 450a, 450b, . . . , 450n as illustrated in the example of FIG. 9.

Figure 9:
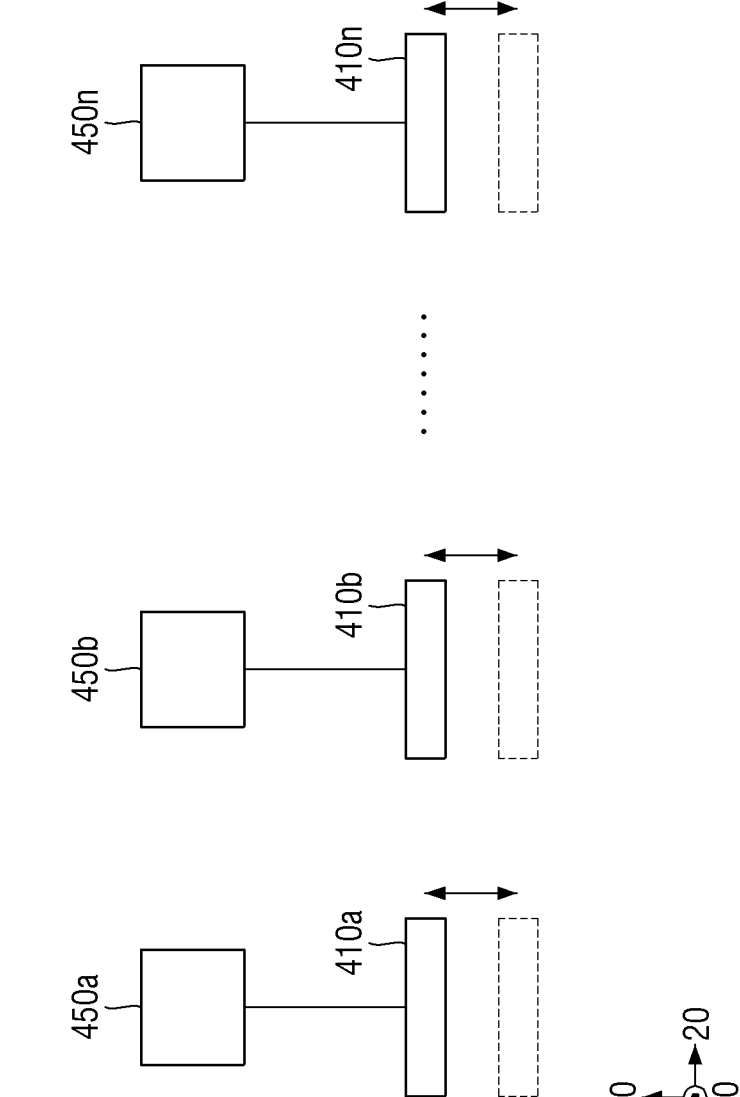
FIG. 9 is a third example diagram for explaining a method of operating the first mirror assembly constituting the first movement control module.

In the examples of FIGS. 7 through 9, the mirrors 410a, 410b, . . . , 410n are disposed in one row. However, the present disclosure is not limited thereto, and the mirrors 410a, 410b, . . . , 410n may also be disposed in one column. Preferably, the mirrors 410a, 410b, . . . , 410n may be disposed in multiple rows and multiple columns. FIG. 7 is a first example diagram for explaining a method of operating the first mirror assembly 410 constituting the first movement control module 310. FIG. 8 is a second example diagram for explaining a method of operating the first mirror assembly 410 constituting the first movement control module 310. FIG. 9 is a third example diagram for explaining a method of operating the first mirror assembly 410 constituting the first movement control module 310.

The mirrors 410a, 410b, . . . , 410n may be moved independently by the actuators 450a, 450b, . . . , 450n, respectively. That is, the mirrors 410a, 410b, . . . , 410n may be moved simultaneously or at different times. When the mirrors 410a, 410b, . . . , 410n are moved simultaneously in the same direction and in the same way, they may also be controlled by one actuator.

Referring again to FIG. 6, as described above, the EUV beam entering the first movement control module 310 is moved to the second mirror assembly 420 by the first mirror assembly 410. The second mirror assembly 420 reflects the EUV beam reflected by the first mirror assembly 410 to the third mirror assembly 430. The second mirror assembly 420 may be provided as a pupil facet mirror (PFM).

Like the first mirror assembly 410, the second mirror assembly 420 may be composed of a plurality of mirrors. The mirrors constituting the second mirror assembly 420 may also be disposed in multiple rows and multiple columns. However, the present disclosure is not limited thereto, and the mirrors may also be disposed in one row or in one column. The positions of the mirrors constituting the second mirror assembly 420 may be fixed.

When both the first mirror assembly 410 and the second mirror assembly 420 is composed of a plurality of mirrors, the number of mirrors constituting the second mirror assembly 420 may be greater than the number of mirrors constituting the first mirror assembly 410, and the mirrors may be disposed to correspond to each other in a ratio of 1:M within the first movement control module 310. Here, M may be a rational number of 2 or more.

For example, if the first mirror assembly 410 is composed of 336 mirrors and the second mirror assembly 420 is composed of 1624 mirrors, the EUV beam reflected by the 336 mirrors may correspond to the 1624 mirrors in a ratio of 1:5. If a beam dump is included, the EUV beam reflected by any one mirror in the first mirror assembly 410 may have six optical paths as it passes through the second mirror assembly 420.

The EUV beam reflected by the second mirror assembly 420 may be formed in a pupil shape. Since the mirrors of the second mirror assembly 420 are fixed, the mirrors of the first mirror assembly 410 may be tilted to align the optical paths with the second mirror assembly 420. In this case, the pupil shape may be determined by changing the position, combination, etc., of beams to be aligned.

The first mirror assembly 410 may be installed to face downward in an upper portion of the first movement control module 310, and the second mirror assembly 420 may be installed to face upward in a lower portion of the first movement control module 310. Due to this structure, the second mirror assembly 420 may be vulnerable to particle fallout and may be easily contaminated. Therefore, the second mirror assembly 420 may be installed such that it can be easily swapped (i.e., replaced). The second mirror assembly 420 may also be installed such that each mirror constituting the second mirror assembly 420 can be individually swapped.

The third mirror assembly 430 reflects the EUV beam reflected by the second mirror assembly 420 to the reticle R. The third mirror assembly 430 may fold the EUV beam and send the folded EUV beam to the reticle R. The third mirror assembly 430 may be provided as, for example, a G-mirror.

Referring again to FIG. 5, the second movement control module 320 moves the EUV beam reflected by the reticle R to the substrate W. The second movement control module 320 may be provided as, for example, a projection optics box (POB) that transfers the reflected EUV beam having pattern information of the reticle R to a wafer.

As described above, the EUV beam containing information about a mask pattern formed on the reticle R is irradiated to the substrate W via the second movement control module 320. The second movement control module 320 may reduce a mask pattern image and transmit the reduced mask pattern image to the substrate W. The second movement control module 320 may, for example, reduce the mask pattern image to 1/N and transmit the reduced mask pattern image to the substrate W. Here, N may be a natural number greater than 2.

Figure 10:
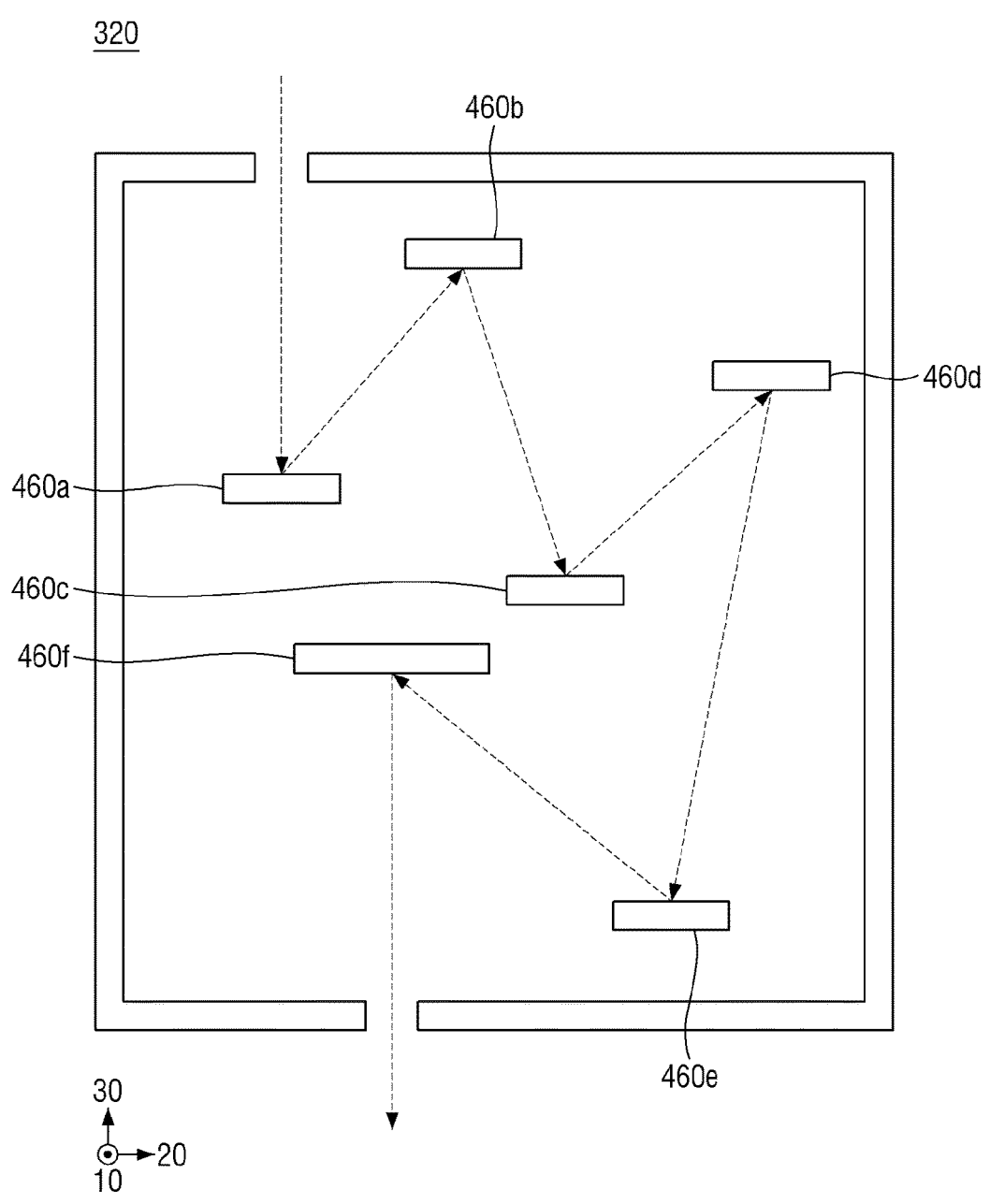
FIG. 10 is an example diagram schematically illustrating the internal structure of the second movement control module constituting the optical module.

The second movement control module 320 may include a plurality of mirror assemblies. For example, the second movement control module 320 may include six mirror assemblies 460a, 460b, 460c, 460d, 460e and 460f as illustrated in the example of FIG. 10. FIG. 10 is an example diagram schematically illustrating the internal structure of the second movement control module 320 constituting the optical module 230.

Some of the mirror assemblies may be installed to face downward from above in the second movement control module 320, and some other mirror assemblies may be installed to face upward from below in the second movement control module 320. Referring to the example of FIG. 10, when the second movement control module 320 includes six mirror assemblies 460a, 460b, 460c, 460d, 460e and 460f, three mirror assemblies 460b, 460d and 460f may be installed as in the former case, and the other three mirror assemblies 460a, 460c and 460e may be installed as in the latter case. However, in the current embodiment, the arrangement structure of the mirror assemblies in the second movement control module 320 is not necessarily limited thereto.

When the second movement control module 320 includes a plurality of mirror assemblies, each mirror assembly may be composed of a plurality of mirrors. Alternatively, some of the mirror assemblies may be composed of one mirror.

When each mirror assembly is composed of a plurality of mirrors, the numbers of mirrors included in the mirror assemblies may be different. Accordingly, the mirror assemblies may have different sizes. However, the present disclosure is not limited thereto, and the numbers of mirrors included in the mirror assemblies may also be the same. Alternatively, the numbers of mirrors included in some mirror assemblies may be the same, and the numbers of mirrors included in some other mirror assemblies may be different.

Referring again to FIG. 1, as described above, scanner equipment using EUV beams suffers from a very large power loss in the process of transmitting an EUV beam to the substrate W. In particular, the first movement control module 310 and the second movement control module 320 in the substrate treating apparatus 100 have limitations in supply and maintenance that make them very difficult to respond quickly after identifying degradation compared with other components. Therefore, it is very important to quickly diagnose and preemptively respond to the power loss.

The first movement control module 310 is a module that an EUV beam encounters first after passing through the IF region 440. When the degree of degradation of the mirrors installed in the first movement control module 310 increases, the power of the EUV beam irradiated to the substrate W is significantly reduced. Therefore, it is necessary to identify the degree of degradation in real time and quickly determine an action plan such as a part swap.

In order to monitor the power of the EUV beam and diagnose factors that cause power loss, the EUV beam that has sequentially passed through the first movement control module 310 and the second movement control module 320 may be directly measured around the substrate W, that is, at a wafer level. However, in this case, independent diagnosis and analysis of a series of components constituting the substrate treating apparatus 100, such as the collector, the first movement control module 310, and the second movement control module 320, can be identified only at the time of replacement of each module. In addition, this method has limitations in accurately budgeting the power loss at the wafer level.

Therefore, in the current embodiment, the monitoring unit 130 is installed in the substrate treating apparatus 100, and the degree of degradation of the EUV beam by the mirrors installed in the substrate treating apparatus 100 is monitored in real time using the monitoring unit 130.

Figure 11:
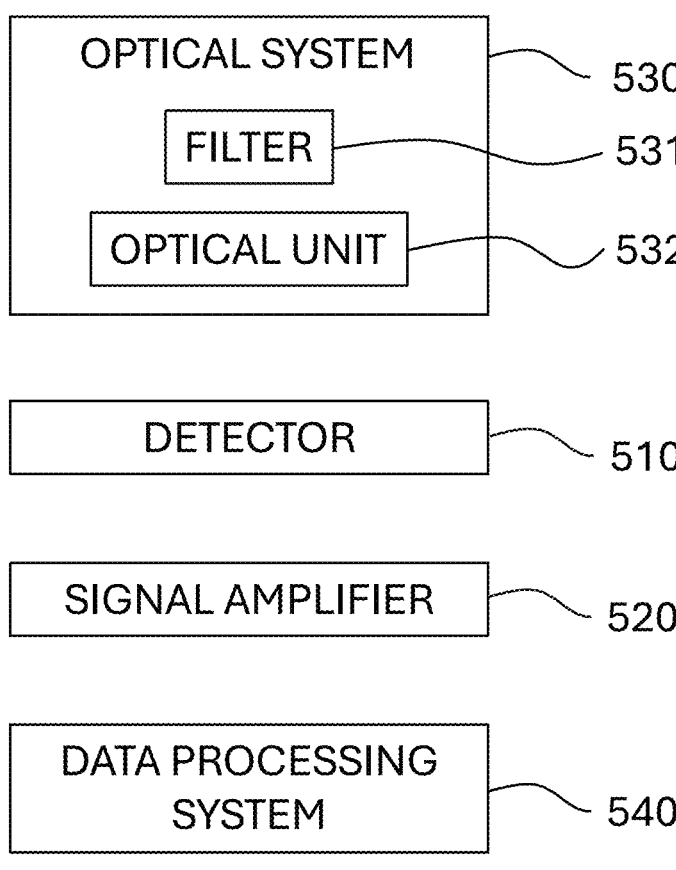
FIG. 11 is a block diagram schematically illustrating the internal configuration of the monitoring unit constituting the substrate treating apparatus using EUV beams.

FIG. 11 is a block diagram schematically illustrating the internal configuration of the monitoring unit 130 constituting the substrate treating apparatus 100 using EUV beams. According to FIG. 11, the monitoring unit 130 may include an optical system 530, a detector 510, a signal amplifier 520, and a data processing system 540.

Figure 12:
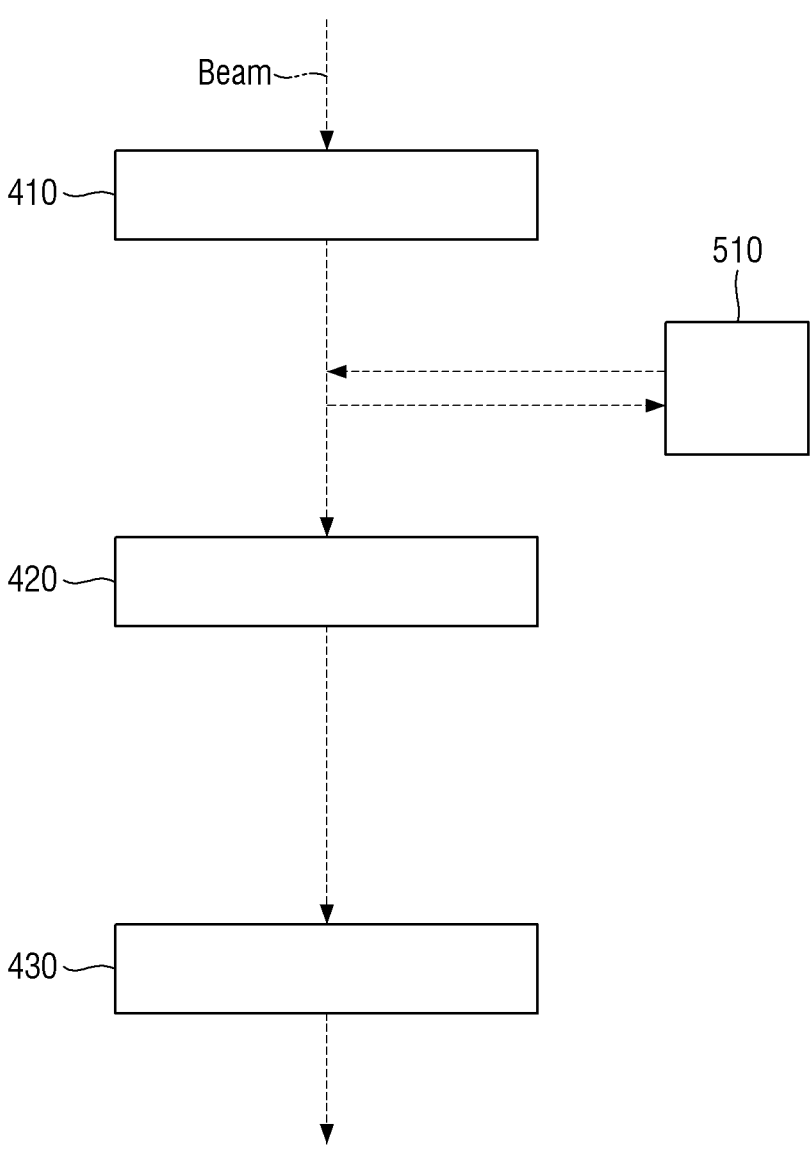
FIG. 12 is a first example diagram for explaining a method of arranging sensors constituting the monitoring unit.

The detector 510 is designed to measure EUV power in real time. As illustrated in the example of FIG. 12, the detector 510 may be installed in the first movement control module 310 and may measure the power of an EUV beam moving within the first movement control module 310. FIG. 12 is a first example diagram for explaining a method of arranging sensors constituting the monitoring unit 130.

The detector 510 may be provided as a sensor that can measure an optical signal. The sensor may have a size of 1 μm to 1 cm, measure beams having a wavelength of 10 to 30 nm, and measure the power, intensity and energy of the beams. The detector 510 may be provided as, for example, a photodiode sensor or a photomultiplier tube (PMT) sensor that can measure the intensity of beams.

Figure 13:
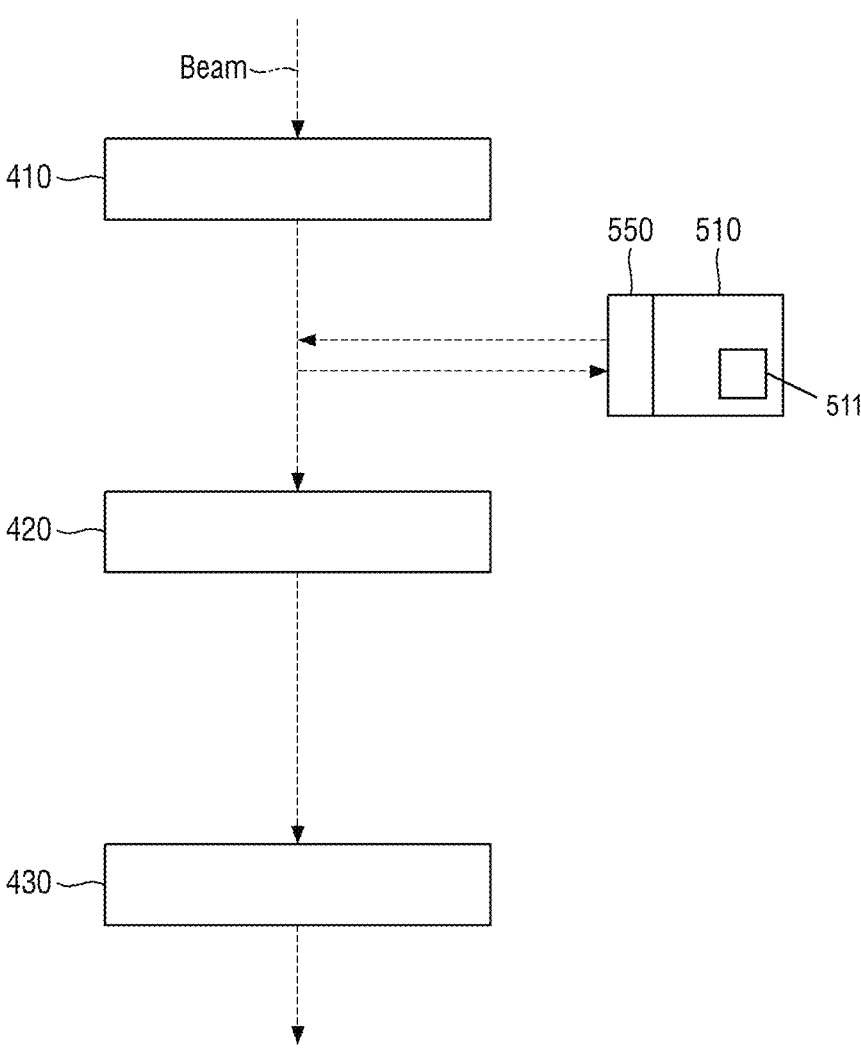
FIG. 13 is an example diagram for explaining a component that can be added to the monitoring unit.

When the detector 510 is provided as a sensor that can measure an optical signal, a special structure 550 may be installed in front of the sensor as illustrated in the example of FIG. 13. The special structure 550 may be a mirror that can concentrate an EUV beam (13.5 nm EUV signal). For example, the mirror may be an EUV special mirror. Alternatively, the special structure 550 may be a special filter that allows only an EUV beam (13.5 nm EUV signal) to be received. FIG. 13 is an example diagram for explaining a component that can be added to the monitoring unit 130.

The detector 510 may be disposed in a space between the first mirror assembly 410 and the second mirror assembly 420 in view of the fact that when the degree of degradation of an EUV beam becomes too large in the first mirror assembly 410 that the EUV beam encounters first after passing through the IF region 440, the power of the EUV beam finally irradiated to the substrate W is significantly reduced. The detector 510 may measure the power of the EUV beam travelling toward the second mirror assembly 420 after passing through the first mirror assembly 410.

However, the present disclosure is not limited thereto, and the detector 510 may also be disposed in a space between the second mirror assembly 420 and the third mirror assembly 430 in the first movement control module 310. Alternatively, the detector 510 may be disposed in a space between the third mirror assembly 430 and an exit in the first movement control module 310. Here, the exit refers to a passage from the inside of the first movement control module 310 to the outside.

In addition, the detector 510 may not necessarily be disposed in any one of the space between the first mirror assembly 410 and the second mirror assembly 420, the space between the second mirror assembly 420 and the third mirror assembly 430 and the space between the third mirror assembly 430 and the exit, but may also be disposed in a plurality of spaces.

Figure 14:
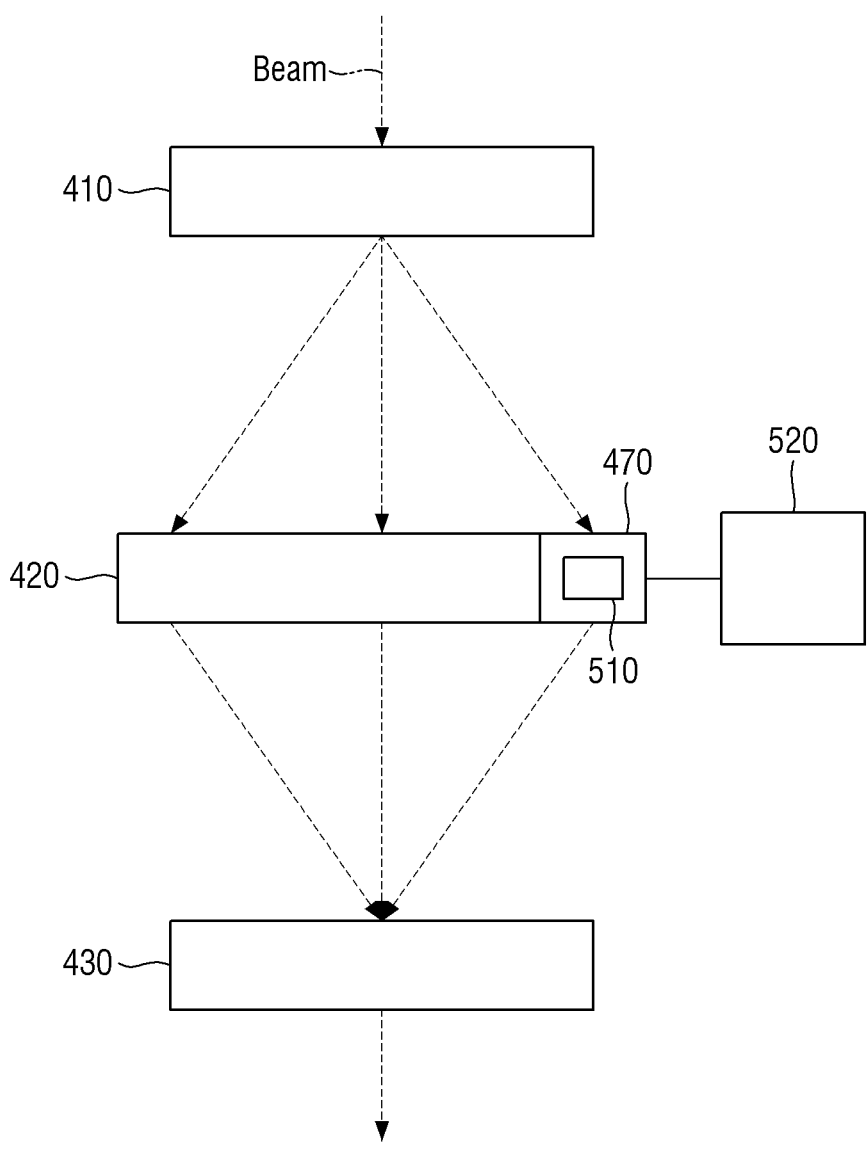
FIG. 14 is a second example diagram for explaining a method of arranging sensors constituting the monitoring unit.

When the detector 510 measures the power of the EUV beam travelling toward the second mirror assembly 420 after passing through the first mirror assembly 410, it may also be installed in a beam dump 470 as illustrated in the example of FIG. 14. FIG. 14 is a second example diagram for explaining a method of arranging sensors constituting the monitoring unit 130.

The beam dump 470 may be disposed side by side with the second mirror assembly 420 in the first movement control module 310. In this case, the beam dump 470 may be coupled to an end of the second mirror assembly 420 or may be spaced apart from the end of the second mirror assembly 420 by a predetermined distance. The beam dump 470 may be disposed at the same level as the second mirror assembly 420. However, the present disclosure is not limited thereto, and the beam dump 470 may also be disposed at a higher or lower level than the second mirror assembly 420.

When the detector 510 is installed in the beam dump 470, it may also be provided as a plurality of sensors instead of one sensor. All of the sensors may be installed inside the beam dump 470. However, the present disclosure is not limited thereto, and all of the sensors may also be attached to an outer surface of the beam dump 470. Alternatively, some of the sensors may be installed inside the beam dump 470, and some other sensors may be attached to the outer surface of the beam dump 470. Even when the detector 510 is provided as one sensor, it may also be attached to the outer surface of the beam dump 470.

The detector 510 may include a Peltier element 511 and may be structured to easily achieve cooling and temperature control when a thermal load increases. The detector 510 may also be formed in the above structure including a thermo-electric element.

The detector 510 may also be formed in a structure in which continuous and reliable calibration is possible.

Referring again to FIG. 11, the signal amplifier 520 amplifies a signal input from the detector 510. When the detector 510 is provided as a photodiode sensor, the signal amplifier 520 may electrically amplify an electrical signal (voltage or current) converted by the photodiode sensor.

The optical system 530 may include a filter 531 and an optical unit 532. The filter 531 may be provided as a specific filter that passes only a beam of a specific wavelength in order to detect only a target EUV beam. The optical unit 532 may focus an EUV beam passing through the filter 531 and may be composed of a small EUV mirror.

An EUV beam signal, that is, an EUV beam focused by the optical system 530 may be transmitted to the detector 510. The data processing system 540 calculates the power of an EUV beam using an electrical EUV signal output from the signal amplifier 520 to monitor the degree of degradation of the EUV beam in real time. The data processing system 540 may calculate the power of the EUV beam according to a procedure illustrated in the example of FIG. 15.

Figure 15:
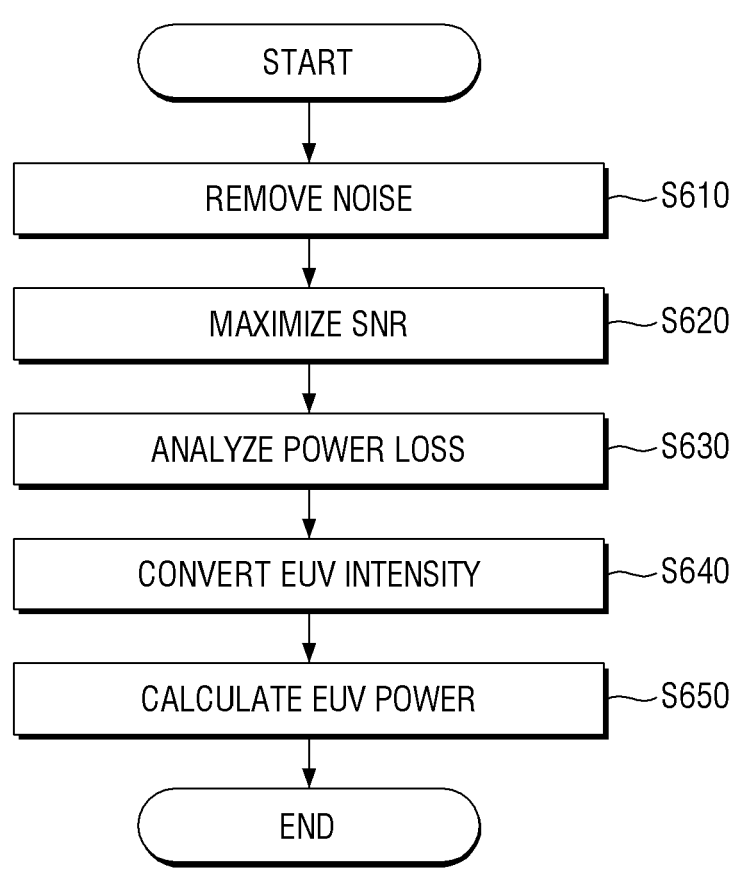
FIG. 15 is a flowchart sequentially illustrating a beam power calculating method of the data processing system constituting the monitoring unit.

FIG. 15 is a flowchart sequentially illustrating a beam power calculating method of the data processing system 540 constituting the monitoring unit 130. The following description will be given with reference to FIG. 15.

First, the data processing system 540 removes noise from an electrical EUV signal (operation S610).

Then, the data processing system 540 maximizes a signal-to-noise ratio (SNR) of the electrical EUV signal from which noise has been removed (operation S620). The data processing system 540 may maximize the SNR by amplifying the SNR using a lock-in amplifier.

Next, the data processing system 540 analyzes power loss of the detected EUV beam between the source part 110 and the first mirror assembly 410 through an algorithm that takes an optical path into consideration (operation S630). Here, the algorithm may consider the path of an EUV beam (e.g., which path has a length) transferred from source plasma by the source part 110 to the first mirror assembly 410 as the optical path.

Next, the data processing system 540 converts and calculates the intensity of the EUV beam, that is, an EUV intensity value, based on the result of the power loss analysis (operation S640). The data processing system 540 may convert the EUV intensity value by applying a conversion factor related to the algorithm.

Next, the data processing system 540 calculates the power of the EUV beam (EUV power) in real time based on the calculated EUV intensity value (operation S650). The data processing system 540 may also calculate a beam profile, a beam image, etc. related to the shape or form of the beam and provide the information.

Until now, the monitoring unit 130 has been described with reference to FIGS. 11 through 15. When the detector 510 is installed in the beam dump 470, even while an EUV beam is being irradiated to the substrate W using the substrate treating apparatus 100, it is possible to accurately measure the power of the EUV beam in real time to compensate for power loss by utilizing the EUV beam input to the beam dump 470 via the first mirror assembly 410.

Figure 16:
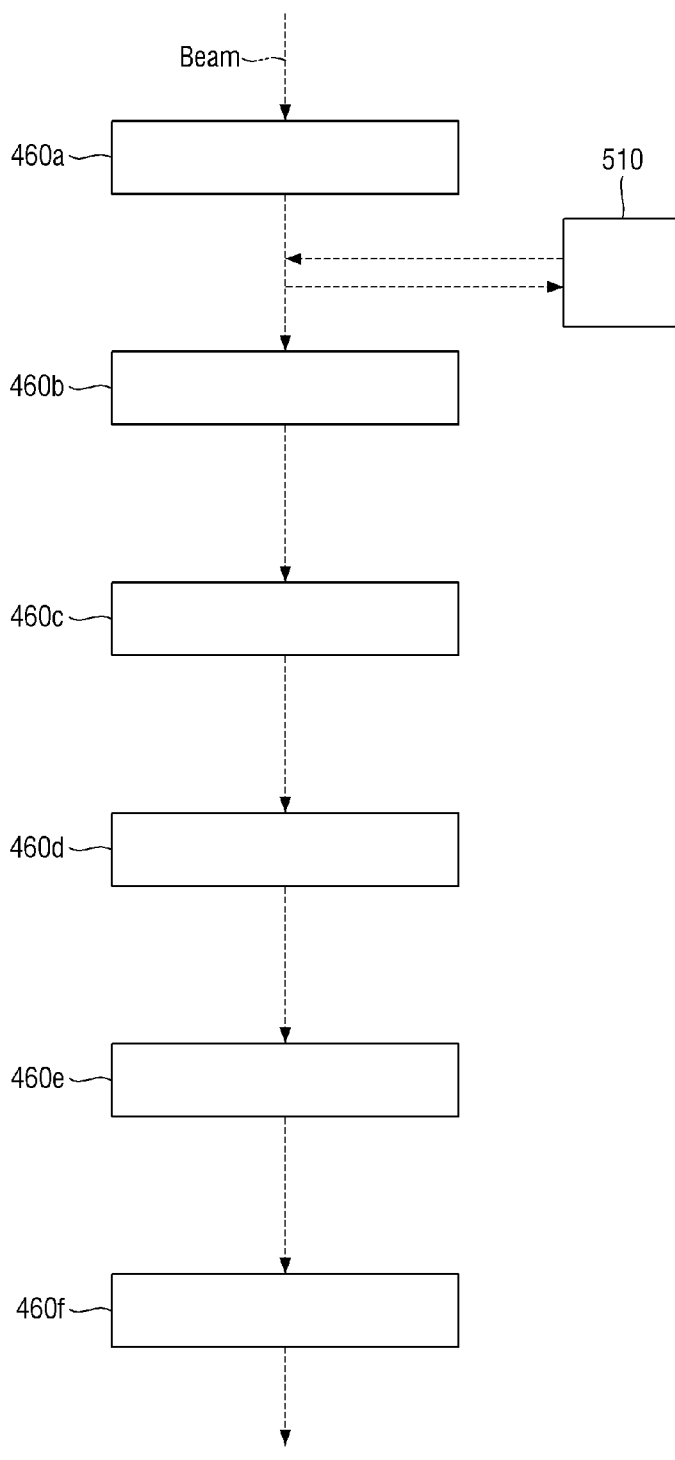
FIG. 16 is a third example diagram for explaining a method of arranging sensors constituting the monitoring unit.

The detector 510 is not necessarily installed in the first movement control module 310 to measure the power of an EUV beam in real time. As illustrated in the example of FIG. 16, the detector 510 may also be installed in the second movement control module 320 and may measure the power of an EUV beam moving in the second movement control module 320. FIG. 16 is a third example diagram for explaining a method of arranging sensors constituting the monitoring unit 130.

The detector 510 may be installed in a space between two different mirror assemblies among the six mirror assemblies 460a, 460b, 460c, 460d, 460e and 460f disposed in the second movement control module 320. For example, the detector 510 may be disposed in a space between a first mirror assembly 460a and a second mirror assembly 460b in the second movement control module 320 and may measure the power of an EUV beam travelling toward the second mirror assembly 460b after passing through the first mirror assembly 460a.

However, the present disclosure is not limited thereto, and the detector 510 may also be disposed in a space between the first mirror assembly 460a and an entrance. Here, the entrance refers to a passage from the outside of the second movement control module 320 to the inside. Alternatively, the detector 510 may be disposed in a space between a sixth mirror assembly 460f and an exit. Here, the exit refers to a passage from the inside of the second movement control module 320 to the outside.

As described above, the detector 510 may be disposed in any one of the space between two different mirror assemblies among the six mirror assemblies 460a, 460b, 460c, 460d, 460e and 460f, the space between the first mirror assembly 460a and the entrance, and the space between the sixth mirror assembly 460f and the exit. However, the present disclosure is not limited thereto, and the detector 510 may also be disposed in a plurality of spaces among the space between two different mirror assemblies among the six mirror assemblies 460a, 460b, 460c, 460d, 460e and 460f, the space between the first mirror assembly 460a and the entrance, and the space between the sixth mirror assembly 460f and the exit.

In addition, one or more detectors 510 may be installed in each of the first movement control module 310 and the second movement control module 320. An equal number of detectors 510 may be installed in the modules 310 and 320. However, the present disclosure is not limited thereto, and different numbers of detectors 510 may also be installed in the modules 310 and 320.

The detector 510 may also be disposed in a space between the first movement control module 310 and the second movement control module 320. In this case, the detector 510 may be disposed in a space between the first movement control module 310 and the reticle R to measure the power of an EUV beam travelling toward the reticle R after passing through the first movement control module 310. Alternatively, the detector 510 may be disposed in a space between the reticle R and the second movement control module 320 to measure the power of an EUV beam travelling toward the second movement control module 320 after passing through the reticle R.

The detector 510 described above may be installed as a photodiode sensor for EUV and may directly measure the power of an EUV beam in real time without affecting exposure. Since the ILLUMO and the POB directly control and transmit an EUV beam, they are the most essential elements in the EUV scanner equipment. Despite this importance, the ILLUMO and the POB have significant limitations in supply and repair because they use an extremely short wavelength, requiring a specially designed reflective optical system, not a general optical system. Therefore, there is an urgent need for a monitoring technology for diagnosing the state of the ILLUMO and the POB in real time to determine the demand for repair and replacement of individual modules in advance.

Recently, optics degradation due to strong EUV energy has been found to be a factor that greatly reduces product productivity. Accordingly, the importance of the monitoring technology has been further increased. However, due to concerns about a reduction in product productivity by insufficient EUV power and structural limitations of an EUV reflective optical system, EUV scanner equipment cannot directly measure EUV on an optical path and can only measure EUV at the final wafer level. Therefore, since it is difficult to diagnose the state of individual modules at an intermediate stage, an indirect estimation method is used. However, this method fails to accurately reflect the actual state of the equipment. In particular, there are cases where the operation of the equipment is stopped due to unexpected mirror contamination in an FFM module including hundreds of small faceted mirrors. Therefore, the indirect estimation method has limitations.

In order to solve the above problems, the monitoring unit 130 of the present disclosure may monitor EUV power in real time by using a sensor capable of measuring an EUV optical signal in the ILLUMO of the EUV scanner equipment. To this end, the monitoring unit 130 may include the detector 510 such as a photodiode sensor or a PMT sensor, the signal amplifier 520, the optical system 530, and the data processing system 540 as described above. Accordingly, aspects of the present disclosure quickly identify and preemptively respond to mirror contamination issues by monitoring the power of the ILLUMO region of the EUV equipment in real time, which has been impossible to measure.

The monitoring unit 130 applicable to exposure equipment using EUV beams and the substrate treating apparatus 100 including the monitoring unit 130 have been described above. However, the current embodiment is not limited thereto, and the monitoring unit 130 may also be applied to exposure equipment using beams other than EUV beams, for example, exposure equipment using deep ultraviolet (DUV) beams.

Exemplary embodiments of the present disclosure have been described hereinabove with reference to the accompanying drawings, but the present disclosure is not limited to the above-described exemplary embodiments, and may be implemented in various different forms, and one of ordinary skill in the art to which the present disclosure pertains may understand that the present disclosure may be implemented in other specific forms without changing the technical concept or features of the present disclosure. Therefore, it is to be understood that the exemplary embodiments described above are illustrative rather than being restrictive in all aspects.

What is claimed is:

1. A substrate treating apparatus comprising:
a source which generates an extreme ultraviolet (EUV) beam;
a scanner which transfers a mask pattern to a substrate by using the EUV beam; and
a monitoring unit which comprises a detector for detecting the EUV beam and monitors an EUV beam power in real time, the detector including a plurality of sensors,
wherein the detector is disposed on a path along which the EUV beam passes through a first mirror assembly provided in the scanner and moves to a reticle on which the mask pattern is formed, and
wherein the scanner further comprises a beam dump which receives the EUV beam reflected by the first mirror assembly, and at least a first sensor of the detector is provided on an outer surface of the beam dump and at least a second sensor of the detector is provided inside the beam dump.

2. The apparatus of claim 1, wherein the scanner comprises:
the first mirror assembly which comprises a plurality of mirrors and receives the EUV beam from the source; and
a second mirror assembly which comprises a plurality of mirrors and reflects the EUV beam reflected by the first mirror assembly to the reticle.

3. The apparatus of claim 2, wherein the mirrors included in the first mirror assembly are moveable, and the mirrors included in the second mirror assembly are fixed.

4. The apparatus of claim 2, wherein the number of mirrors included in the second mirror assembly is greater than the number of mirrors included in the first mirror assembly.

5. The apparatus of claim 1, wherein the scanner further comprises a second mirror assembly which comprises a plurality of mirrors and reflects the EUV beam reflected by the first mirror assembly to the reticle, and the beam dump is disposed at the same level as the second mirror assembly.

6. The apparatus of claim 1, wherein the monitoring unit comprises:
a filter which filters the EUV beam;
an optical system which focuses the filtered EUV beam;
the detector, which receives the focused, filtered EUV beam;
a signal amplifier which amplifies an electrical signal output by the detector; and
a data processor which calculates the EUV beam power based on the electrical signal.

7. The apparatus of claim 6, wherein the detector comprises a photodiode sensor.

8. The apparatus of claim 7, wherein the detector further comprises a Peltier element or a thermoelectric element.

9. The apparatus of claim 6, wherein the data processor removes noise from the electrical signal, amplifies a signal-to-noise ratio of the electrical signal, analyzes power loss of the EUV beam using an algorithm that takes an optical path into consideration, calculates the intensity of the EUV beam based on the result of the power loss analysis, and calculates the EUV beam power based on the calculated intensity.

10. The apparatus of claim 9, wherein when analyzing the power loss of the EUV beam, the data processing system uses a path of the EUV beam transferred from source plasma by the source to the first mirror assembly as the optical path.

11. The apparatus of claim 9, wherein when calculating the intensity of the EUV beam, the data processing system uses a conversion factor related to the algorithm.

12. The apparatus of claim 9, wherein the data processing system further calculates a beam profile and a beam image.

13. A substrate treating apparatus which irradiates an EUV beam to a substrate, comprising:

a monitoring unit installed in the substrate treating apparatus, and configured to monitor an EUV beam power in real time, the monitoring unit comprising:

an optical system which filters and focuses the EUV beam;

a detector which detects the focused, filtered EUV beam, the detector including a plurality of sensors, at least some of which are located inside a beam dump;

a signal amplifier which amplifies an electrical signal output by the detector; and a data processor which calculates the EUV beam power based on the electrical signal.

14. The substrate treating apparatus of claim 13, wherein the detector is disposed on a path along which the EUV beam passes through a first mirror assembly provided in a scanner, which transfers a mask pattern to the substrate by using the EUV beam, and moves to a reticle on which the mask pattern is formed.

15. The substrate treating apparatus of claim 14, wherein the detector is disposed at the same level as a second mirror assembly which reflects the EUV beam reflected by the first mirror assembly to the reticle and some sensors of the plurality of sensors of the detector are provided on an outer surface of the beam dump, which receives the EUV beam reflected by the first mirror assembly.

16. The substrate treating apparatus of claim 13, wherein the data processor removes noise from the electrical signal, amplifies a signal-to-noise ratio of the electrical signal, analyzes power loss of the EUV beam using an algorithm that takes an optical path into consideration, calculates the intensity of the EUV beam based on the result of the power loss analysis, and calculates the EUV beam power based on the calculated intensity.

17. A substrate treating apparatus comprising:

a source which generates an EUV beam;

a scanner which transfers a mask pattern to a substrate by using the EUV beam; and a monitoring unit which monitors an EUV beam power in real time, wherein the monitoring unit includes a detector which detects the EUV beam, a filter which filters the EUV beam before it reaches the detector or a mirror that concentrates the EUV beam before it reaches the detector, and and a data processor which calculates the EUV beam power based on an electrical signal output by the detector, wherein the scanner includes a first mirror assembly which comprises a plurality of mirrors and receives the EUV beam from the source, a second mirror assembly which comprises a plurality of mirrors and reflects the EUV beam reflected by the first mirror assembly to a reticle, and a beam dump which is disposed at the same level as the second mirror assembly and receives the EUV beam reflected by the first mirror assembly, wherein the detector includes at least a first sensor provided on an outer surface of the beam dump, and at least a second sensor located inside the beam dump.

*   *   *   *   *